(12) United States Patent
Yamada

(10) Patent No.: US 6,192,091 B1
(45) Date of Patent: Feb. 20, 2001

(54) CIRCUIT FOR REPRODUCING A CLOCK FROM A MULTILEVEL QAM SIGNAL

(75) Inventor: Koji Yamada, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/082,708

(22) Filed: May 22, 1998

(30) Foreign Application Priority Data

May 22, 1997 (JP) .................................................. 9-132205

(51) Int. Cl.$^7$ ............................... H04L 7/00; H04L 27/06

(52) U.S. Cl. ............................................ 375/355; 375/340

(58) Field of Search ..................................... 375/261, 316, 375/340, 355; 329/304–307; 328/72; 327/291

(56) References Cited

U.S. PATENT DOCUMENTS

| | | | | |
|---|---|---|---|---|
| 4,599,732 | * | 7/1986 | LeFever ................................ | 375/355 |
| 5,438,591 | * | 8/1995 | Oie et al. .............................. | 375/261 |
| 5,528,634 | * | 6/1996 | Griph et al. ........................... | 375/355 |
| 5,872,815 | * | 2/1999 | Strolle et al. ......................... | 329/304 |

FOREIGN PATENT DOCUMENTS

| | | |
|---|---|---|
| 5-236043 | 9/1993 | (JP) . |
| 6-37838 | 2/1994 | (JP) . |
| 6-152667 | 5/1994 | (JP) . |
| 6-252967 | 9/1994 | (JP) . |
| 6-276247 | 9/1994 | (JP) . |
| 8-70332 | 3/1996 | (JP) . |
| 8-256190 | 10/1996 | (JP) . |
| 9-27829 | 1/1997 | (JP) . |
| 5-62236 | 5/1998 | (JP) . |

OTHER PUBLICATIONS

Japanese Office Action, dated Jul. 13, 1999, with English Language Translation of Japanese Examiner's comments.

* cited by examiner

Primary Examiner—Tesfaldet Bocure
(74) Attorney, Agent, or Firm—McGuireWoods LLP

(57) ABSTRACT

In a clock reproducing circuit for use in a multilevel QAM demodulation circuit and including a clock phase error detecting circuit receiving a digital in-phase signal to generate a phase error signal, and a voltage controlled oscillator receiving the phase error signal through a loop filter, for generating a reproduced clock, the clock phase error detecting circuit comprises first and second delay circuits receiving the digital in-phase signal, the first delay circuit generating a ½-data period delayed signal, and the second delay circuit generating a one-data period delayed signal; an offset value generating circuit receiving the in-phase signal and the one-data period delayed signal for generating an offset value; a first subtracting circuit for subtracting the offset value from the ½-data period delayed signal to generate a first phase error signal; a second subtracting circuit for subtracting the one-data period delayed signal from the in-phase signal to generate a subtraction result signal; a sign inverting circuit for selectively inverting the sign of the first phase error signal on the basis of the subtraction result signal, to output a second phase error signal; a first discriminating circuit for comparing the subtraction result signal with a first threshold to output a first discrimination result signal; an addition circuit for adding the one-data period delayed signal to the in-phase signal to generate an addition result signal; a second discriminating circuit for comparing the addition result signal with a second threshold to output a second discrimination result signal; and a gate circuit controlled by the first and second discrimination result signals either to output the second phase error signal as the phase error signal or output a held signal as the phase error signal.

2 Claims, 7 Drawing Sheets

CIRCUIT FOR REPRODUCING A CLOCK FROM A MULTILEVEL QAM SIGNAL

BACKGROUND OF THE INVENTION

1. Field of the Invention

The present invention relates to a digital multilevel QAM (quadrature amplitude modulation) demodulation, and more specifically to a clock reproducing circuit for reproducing a clock from a multilevel QAM signal.

2. Description of Related Art

A multilevel QAM transmission system, which is one of digital transmission systems, now attracts attention in the field requiring the transmission of a large amount of digital data, such as a bi-directional TV, an internet distribution using a cable modem, etc.

One of major technologies in the multilevel QAM demodulation, is a clock reproduction, which is a technology for reproducing a clock in synchronism with a data rate, on the basis of a multilevel QAM signal supplied from a multilevel QAM modulator. The clock reproduction is a key for realizing a stable demodulation.

Referring to FIG. 1, there is shown a block diagram illustrating a construction of a conventional multilevel QAM demodulation system. In FIG. 1, Reference Numeral 522 designates an input terminal, and Reference Numerals 523 and 524 indicate a multiplication-detection circuit (mixer). Reference Numeral 525 shows a carrier reproducing circuit, and Reference Numeral 526 denotes a 90° phase shifter. Reference Numerals 527 and 529 designate a low pass filter, and Reference Numerals 528 and 530 indicate an analog to digital (A/D) converter. Reference Numeral 531 shows a QAM demodulation circuit, and Reference Numeral 532 denotes an output terminal. Reference Numeral 533 designates a clock reproducing circuit, and Reference Numeral 534 indicates clock phase error detection circuit. Reference Numeral 535 shows a loop filter, and Reference Numeral 536 denotes a voltage controlled oscillator (VCO). "I" designates an analog in-phase signal, and "Q" shows an analog quadrature signal. "$I_D$" shows a digital in-phase signal, and "$Q_D$" denotes a digital quadrature signal.

A multilevel QAM signal supplied through the input terminal 522 shown in FIG. 1 is branched into two paths, which are connected to the multiplication-detection circuits 523 and 524, respectively. In addition, an output of the carrier reproducing circuit 525 is also branched into two paths, and one of which is supplied to one of the multiplication-detection circuits 523, and the other of which is phase-shifted by the 90° phase shifter 526 and supplied to the other multiplication-detection circuit 524. Thus, the multiplication-detection circuits 523 and 524 carry out the multiplication-detection to output a demodulated analog in-phase signal "I" and a demodulated analog quadrature signal "Q" through the low pass filters 527 and 529 to the A/D converters 528 and 530, respectively, which generate a coded digital in-phase signal "$I_D$" and a coded digital quadrature signal "$Q_D$".

Either of the coded signals "$I_D$" and "$Q_D$" (the signal "$I_D$" in the shown example) is supplied to the clock reproducing circuit 533, in which the coded signal is inputted to the clock phase error detecting circuit 534, which then outputs a phase error signal through the loop filter 535 to supply a control voltage to the voltage controlled oscillator 536. This voltage controlled oscillator 536 generates a clock to be supplied to the A/D converters 528 and 530 and the QAM demodulation circuit 531. Thus, the clock is reproduced.

In order to reproduce the clock in the multilevel QAM demodulation circuit, Japanese Patent Application Pre-examination Publication No. JP-A-06-276247 (the content of which is incorporated by reference in its entirety into this application, and also an English abstract of JP-A-06-276247 is available from the Japanese Patent Office and the content of the English abstract of JP-A-06-276247 is also incorporated by reference in its entirety into this application) proposed an approach of utilizing, as a phase error signal, a signal delayed from a present input signal by a half of data period (½-data-period delayed signal) when the present input signal and a one-data-period delayed signal are in a certain relation.

Referring to FIG. 2, there is a graph illustrating a signal change in a prior art clock phase error detecting circuit. In this graph, Reference Numeral 601 designates a level discriminating range. In the clock phase error detecting circuit proposed by the above referred Japanese patent publication, attention is focused to the signal which changes as signals "a" and "b" shown in FIG. 2, during one data period, for the purpose of detecting a phase error. Namely, the signal so changes that the chain line in FIG. 2, which approximates the change between the signals "a" and "b" to a straight line, crosses the straight line "0" at a level "0". In the following, the signal change that the chain line crosses the straight line "0", will be called a "zero cross change", and the intersection between the chain line and the straight line "0" will be called a "zero cross point". In addition, an intermediate point of one data period will be called a ½-data-period-point".

Under this assumption, paying attention to the data at the ½-data-period-point, if the clock and the data are in synchronism, it becomes ½-data-period-point=zero cross point, so that an average of the signal becomes zero. However, if the clock and the data are out of synchronism, the average of the signal has some value, which can be considered to be the phase error.

Referring to FIG. 3, there is shown a block diagram illustrating the construction of the prior art clock phase error detecting circuit. In FIG. 3, Reference Numeral 701 designates an input terminal, and Reference Numerals 702 and 703 show a delay circuit. Reference Numeral 704 indicates a subtraction circuit, and Reference Numerals 705 and 711 denote a discrimination circuit. Reference Numerals 706 and 712 designate a threshold value input terminal, and Reference Numeral 707 shows a sign inversion circuit. Reference Numeral 708 indicates a gate circuit, and Reference Numeral 709 denotes an output terminal. Reference Numeral 710 designates an addition circuit. Reference Character "a" shows an input signal, and Reference Character "b" indicates a one-data-period delay signal. Reference Character "c" denotes a ½-data-period delayed signal, and Reference Character "f" designates a phase error signal.

In this prior art clock phase error detecting circuit, the input signal "a" supplied through the input terminal 701 is supplied directly to one input of the subtraction circuit 704, and also supplied through the two delay circuits 702 and 703, as the one-data-period delay signal "b", to the other input of the subtraction circuit 704, which outputs a subtraction result (a−b). At the same time, the input signal "a" and the one-data-period delay signal "b" are supplied to the addition circuit 710, which outputs an addition result (a+b). On the basis of the subtraction result (a−b), the sing inversion circuit 707 inverts or does not invert the ½-data-period delayed signal "c" outputted from the delay circuit 702, so that the phase error signal "f" is outputted from the sing inversion circuit 707. The discrimination circuit 705 discriminates which of the absolute value |a−b| of the subtraction result of the subtraction circuit 704 and a threshold supplied from the input terminal 706 is large. The discrimination circuit 711 discriminates which of the absolute value |a+b| of the addition result of the addition circuit 710 and a threshold supplied from the input terminal 712 is large. On the basis of respective discrimination results of the two discrimination circuits 705 and 711, the gate circuit 708 is controlled either to output the phase error signal "f" outputted from the sing inversion circuit 707 to the output terminal 709, or to maintain a preceding output.

Here, in the discrimination circuit 705, whether or not the signal "a", "b" changes to cross the "0" level, is discriminated on the basis of whether or not the absolute value |a−b| of the subtraction result of the subtraction circuit 704 is larger than a first threshold supplied from the input terminal 706 (the value corresponding to about 70% of a maximum signal change). In the discrimination circuit 711, whether or not the signal "a" and the signal "b" shown in FIG. 2 are in symmetry, is discriminated on the basis of whether or not the absolute value |a+b| of the addition result of the addition circuit 710 is larger than a second threshold supplied from the input terminal 712 (the value near to "0").

FIG. 4 is a graph illustrating an operation of the sign inversion circuit. The sign inversion circuit 707 makes the polarity of the phase error signal in match with a phase-lag/phase-lead of the clock. As shown in FIG. 4, when (a'−b')>0, the phase error signal "c" is not inverted, and when (a−b)<0, the phase error signal "c" is inverted, so that the phase error signal becomes positive (+) when the clock phase is in advance and negative (−) when the clock phase is in delay.

FIG. 2 shows an example of 16QAM, so that a value of two bits is derived from each of the in-phase signal and the quadrature signal. For this purpose, the level discriminating range 601 is set as dotted lines in FIG. 2. In the example as shown in FIG. 2, the signal "a" is discriminated as "01", and the signal "b" is discriminated as "10".

FIG. 5 is a graph illustrating the change of the signal which does not shown the zero cross change. In the prior art, the detection of the phase error signal used for the clock reproduction has been limited to the case in which the input signal "a" and the one-data-period delayed signal "b" greatly changes as defined by the first threshold. The reason for this is that, when the signal change is small as shown in FIG. 5, it is difficult to approximate the path moving between two points "a" and "b" to a straight line, and therefore, it becomes impossible to accurately define the phase error signal.

In addition, if the signal "a" and the signal "b" is not in symmetry, the ½-data-period delayed signal does not exist in proximity of the zero cross point, with the result that it becomes impossible to accurately define the phase error signal. Because of this reason, it is required to ensure the symmetry property between the signal "a" and the signal "b" by the second threshold.

When the QAM value is small, since there occur many data changes fulfilling the phase error detecting condition (that the signal shows the zero cross change and the ½-data-period delayed signal exists in proximity of the zero cross point), even the prior art can reproduce the clock with a high degree of precision. However, if the QAM value becomes large, the percentage of signal changes fulfilling the phase error detecting condition, to all the signal changes, lowers, as ¼ in 16QAM, ⅛ in 64QAM, and ¹⁄₁₆ in 256QAM, with the result that the data updating times decrease, and a jitter component increases in the prior art, so that it become impossible to reproduce the clock with a high degree of precision. Namely, the larger the QAM value is, the prior art becomes impossible to reproduce the clock with a high degree of precision.

SUMMARY OF INVENTION

Accordingly, it is an object of the present invention to provide a clock reproducing circuit for reproducing a clock from a multilevel QAM signal, which has overcome the above mentioned defect of the conventional one.

Another object of the present invention is to provide a clock reproducing circuit for reproducing a clock from a multilevel QAM signal with a high degree of precision, even if the QAM value is large.

Still another object of the present invention is to provide a clock reproducing circuit for reproducing from a multilevel QAM signal a clock having a reduced jitter component and therefore a high degree of precision, by increasing the number of conditions of signal changes which can be used for detecting the phase error of the clock, thereby to increasing the data updating times.

The above and other objects of the present invention are achieved in accordance with the present invention by a clock reproducing circuit for use in a multilevel QAM demodulation circuit including at least a local carrier reproducing means for generating a first local carrier and a second local carrier having a phase difference of 90° from the first local carrier, a first multiplication-detection circuit for multiplication-detecting an input multilevel QAM signal by the first local carrier to generate an analog in-phase signal, a second multiplication-detection circuit for multiplication-detecting the input multilevel QAM signal by the second local carrier to generate an analog quadrature signal, a first analog-to-digital converter receiving the analog in-phase signal through a first low pass filter to generate a digital in-phase signal, a second analog-to-digital converter receiving the analog quadrature signal through a second low pass filter to generate a digital quadrature signal, the clock reproducing circuit including a clock phase error detecting circuit receiving one of the digital in-phase signal and the digital quadrature signal to generate a phase error signal, and a voltage controlled oscillator receiving the phase error signal through a loop filter, for generating a clock which is supplied to the first and second analog-to-digital converters, the clock phase error detecting circuit comprising:

first and second delay circuits receiving, as a digital input signal, the one of the digital in-phase signal and the digital quadrature signal, the first delay circuit generating a ½-data period delayed signal, and the second delay circuit generating a one-data period delayed signal;

an offset value generating circuit receiving the digital input signal and the one-data period delayed signal for generating an offset value;

a first subtracting circuit for subtracting the offset value from the ½-data period delayed signal to generate a first phase error signal;

a second subtracting circuit for subtracting the one-data period delayed signal from the digital input signal to generate a subtraction result signal;

a sign inverting circuit for selectively inverting the sign of the first phase error signal on the basis of the subtraction result signal, to output a second phase error signal;

a first discriminating circuit for comparing the subtraction result signal with a first threshold to output a first discrimination result signal;

an addition circuit for adding the one-data period delayed signal to the digital input signal to generate an addition result signal;

a second discriminating circuit for comparing the addition result signal with a second threshold to output a second discrimination result signal; and a gate circuit controlled by the first and second discrimination result signals either to output the second phase error signal as the phase error signal or output a held signal as the phase error signal.

The above mentioned offset value generating circuit preferably includes a first slicer receiving the digital input signal for level-discriminating the digital input signal, a second slicer receiving the one-data period delayed signal for level-discriminating the one-data period delayed signal, an adder for adding output signals of the first and second slicers, and a shifter for halving an output of the adder.

Other than the situation in which the signals "a" and "b" shown in FIG. 2 changes in such a manner that the chain line linearly approximating the change between the signals "a" and "b" crosses in proximity of the zero cross point at a ½-data-period point, there is a signal changing to cross the "0" level, as shown in FIG. 8. Here, when the signals "a" and "b" are normalized to signals a' and b' (when the signal "a" is in the range of {a'−α}<a<{a'+α}, the signal "a" is regarded as the signal a'), a new reference is prepared between the signals a' and b', as a dotted line X in FIG. 8, and it is regarded that the signals a' and b' are in symmetry to the new reference X. Under this consideration, the offset compensation is carried out by subtracting the deviation between the "0" level line and the new reference line X,{(a'+b')/2}, from the ½-data-period delayed signal, in the process for generating the phase error signal. With this arrangement, the phase error detecting conditions can be increased, with the result that the data updating times can be increased in comparison with the prior art.

The offset-compensated data includes an error more than the prior art. However, since the phase error detecting conditions are limited to the zero cross change, similarly to the prior art, and if the data updating times are increased with the result that the error is equalized, the influence of the error can be minimized. As a result, the present invention can reduce the jitter component in comparison with the prior art, so that the clock can be reproduced with a high degree of precision.

The above and other objects, features and advantages of the present invention will be apparent from the following description of preferred embodiments of the invention with reference to the accompanying drawings.

DESCRIPTION OF THE PREFERRED EMBODIMENTS

Figure 1:
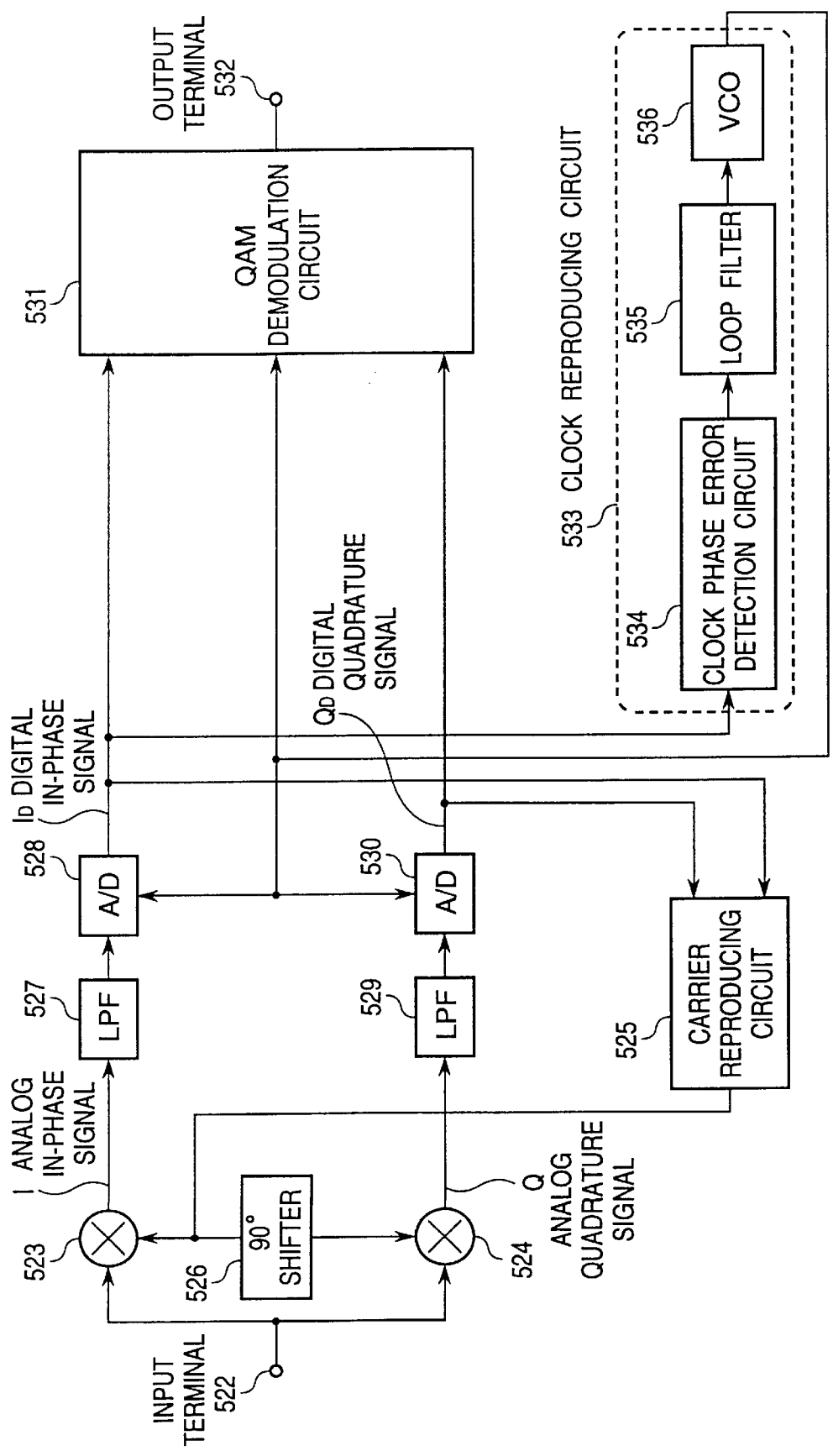
FIG. 1 is a block diagram illustrating a construction of a conventional multilevel QAM demodulation system.

Now, the present invention will be described with reference to the accompanying drawings. The present invention relates to the clock reproducing circuit incorporated in the multilevel QAM demodulation system, as described hereinbefore with reference to FIG. 1, and characterized in the clock phase error detecting circuit included in the clock reproducing circuit comprising the clock phase error detecting circuit, the loop filter and the voltage controlled oscillator. Therefore, since the multilevel QAM demodulation system, the loop filter and the voltage controlled oscillator have been explained in connection with the prior art example, explanation thereof will be omitted here, and a detailed explanation will be made about the clock phase error detecting circuit.

Figure 6:
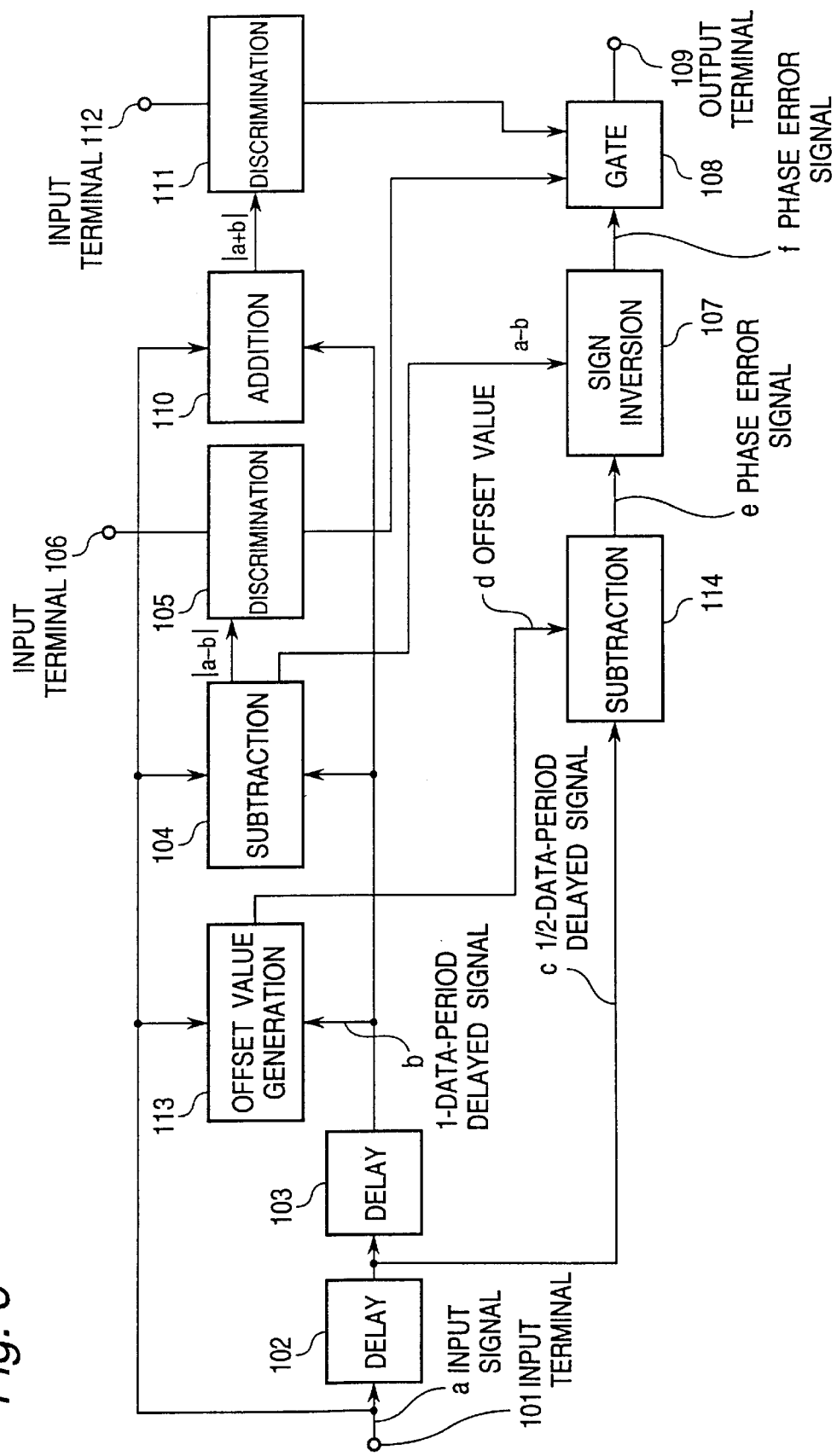
FIG. 6 is a block diagram of one embodiment of the clock phase error detecting circuit in accordance with the present invention used in the multilevel QAM demodulation system.
Figure 7:
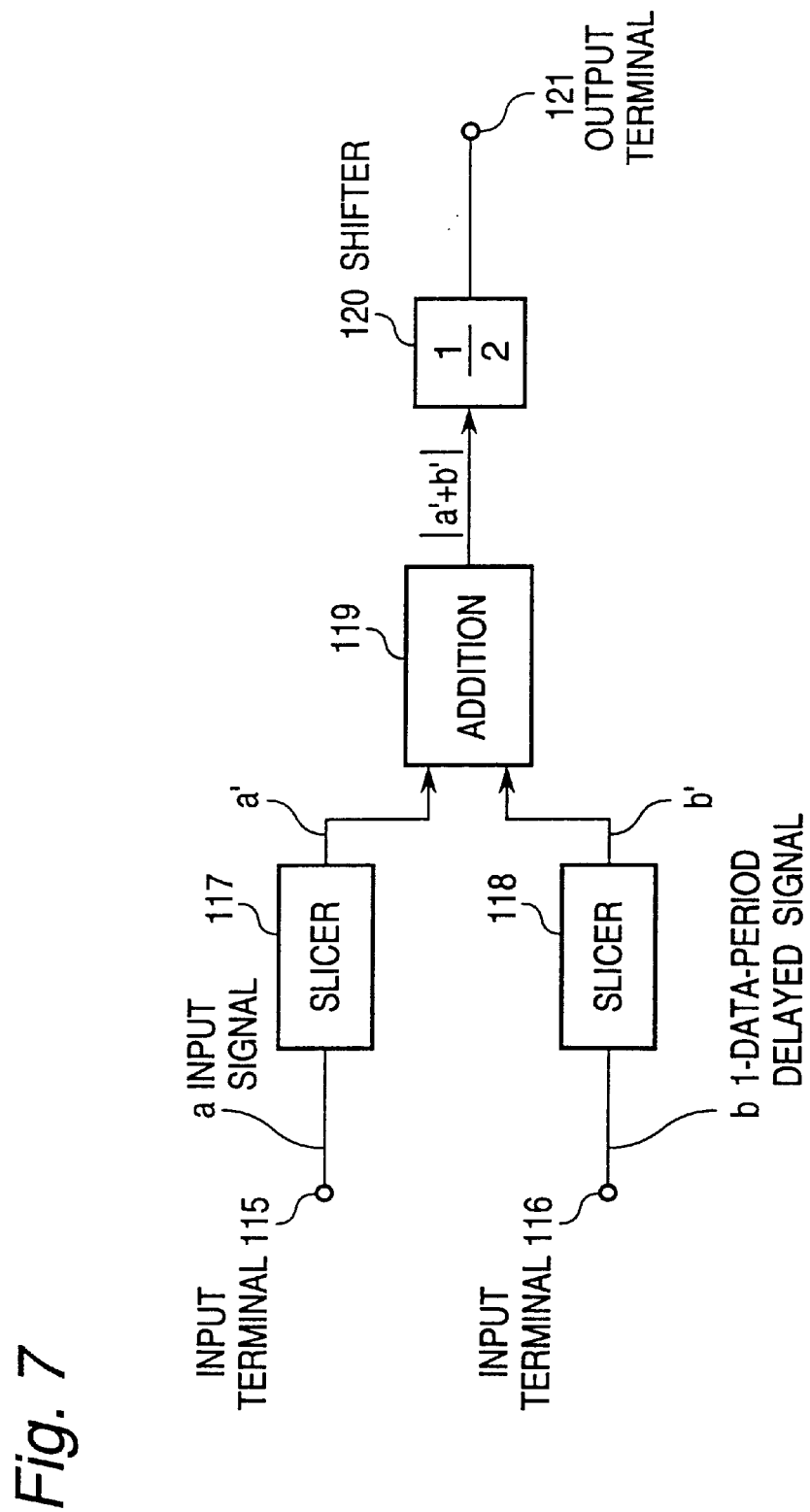
FIG. 7 is a block diagram of one example of the offset value generating circuit incorporated in the clock phase error detecting circuit shown in FIG. 6.

FIG. 6 is a block diagram of one embodiment of the clock phase error detecting circuit, and FIG. 7 is a block diagram of one example of the offset value generating circuit incorporated in the clock phase error detecting circuit.

In FIGS. 6 and 7, Reference Numerals 101, 115 and 116 designate an input terminal, and Reference Numerals 102 and 103 show a delay circuit. Reference Numerals 104 and 114 indicate a subtraction circuit, and Reference Numerals 105 and 111 denote a discrimination circuit. Reference Numerals 106 and 112 designate a threshold value input terminal, and Reference Numeral 107 shows a sign inversion circuit. Reference Numeral 108 indicates a gate circuit, and Reference Numeral 109 and 121 denote an output terminal. Reference Numerals 110 and 119 designate an addition circuit, and Reference Numeral 113 shows an offset value generating circuit. Reference Numerals 117 and 118 indicate a slicer, and Reference Numeral 120 denotes a shifter. Reference Character "a" shows an input signal, and Reference Character "b" indicates a one-data-period delay signal. Reference Character "c" denotes a ½-data-period delayed signal, and Reference Character "d" designates an offset value. Reference Characters "e" and "f" indicates a phase error signal, and Reference Characters a' and b' denote a slicer output signal.

Figure 3:
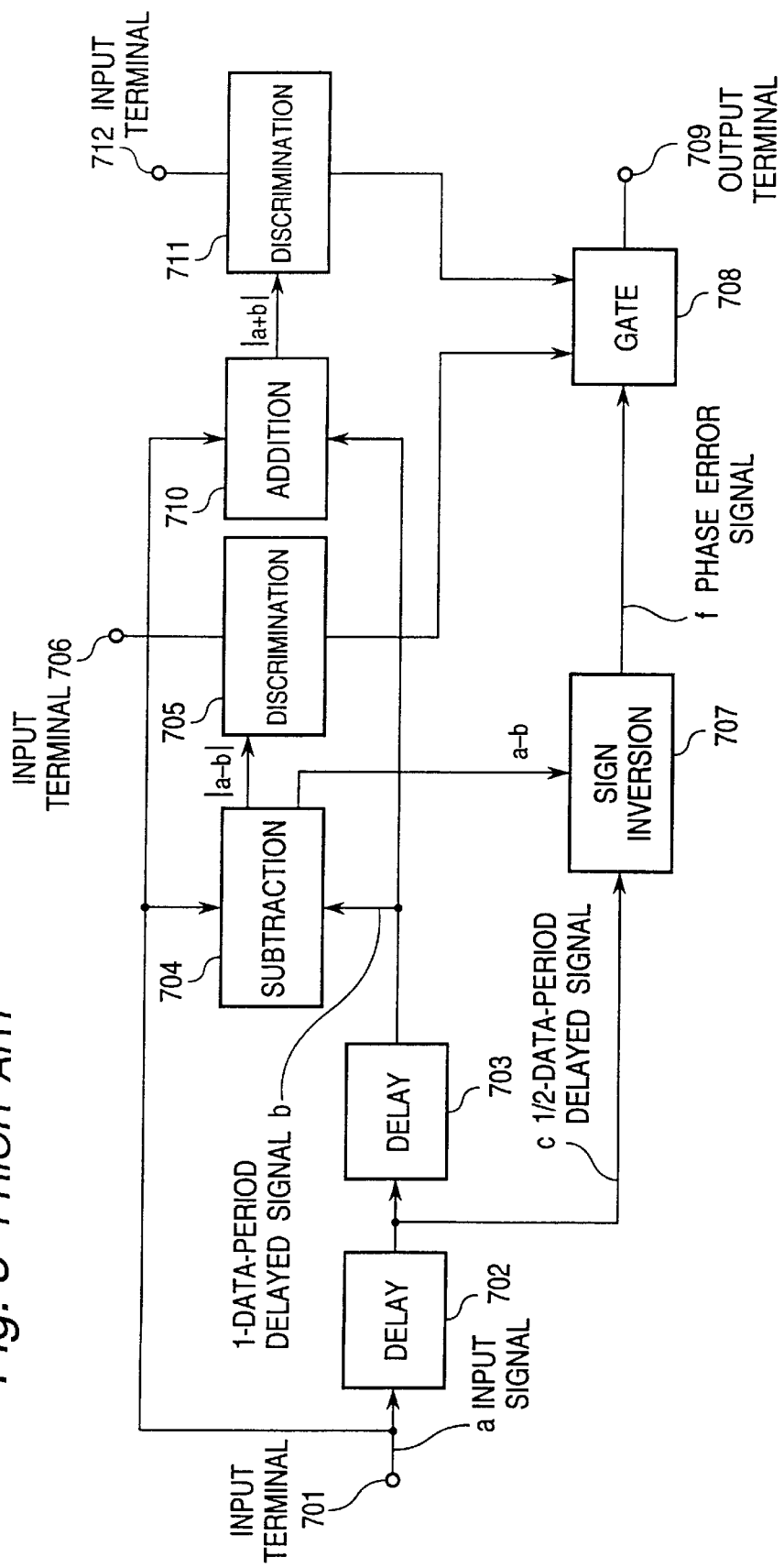
FIG. 3 is a block diagram illustrating the construction of the prior art clock phase error detecting circuit.
Figure 4:
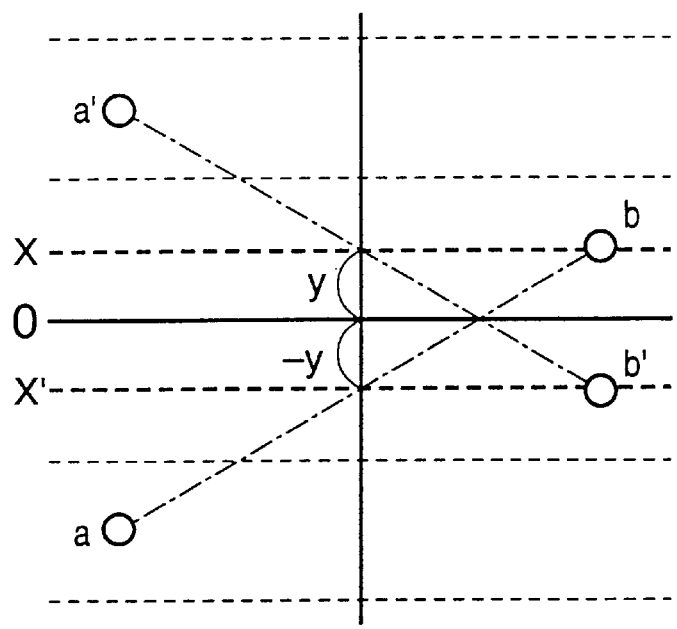
FIG. 4 is a graph illustrating an operation of the sign inversion circuit.
Figure 5:
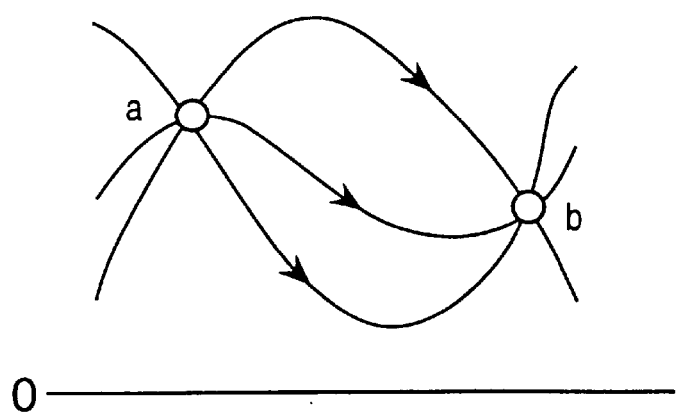
FIG. 5 is a graph illustrating the change of the signal which does not shown the zero cross change.

The constituting elements 101 to 112 correspond to the constituting elements 701 to 712 included in the clock phase error detecting circuit shown in FIG. 3, and therefore, the shown embodiment is characterized in that the construction shown in FIG. 3 is added with the offset value generating circuit 113 receiving the input signal "a" supplied to the input terminal 101 and the one-data-period delayed signal "b" outputted from the cascaded delay circuits 102 and 103 for a generating the offset value "d", and the subtraction circuit 114 for subtracting the offset value "d" from the ½-data period delayed signal "c" from the delay circuit 702. Therefore, the clock reproducing circuit in accordance with this embodiment of the present invention is completed by substituting the clock phase error detection circuit shown in FIG. 6 for the clock phase error detection circuit 534 in the clock reproducing circuit 533 shown in FIG. 1

As shown in FIG. 7, the offset value generating circuit 113 comprises the slicer 117 receiving the input signal "a" supplied through the input terminal 115 (connected to the input terminal 101) for the purpose of discriminating the level of the input signal "a", the slicer 118 receiving the one-data-period delayed signal "b" supplied through the input terminal 116 (connected to the output of the delay circuit 103) for the purpose of discriminating the level of the one-data-period delayed signal "b", the addition circuit 119 receiving respective outputs a' and b' of the slicers 117 and 118 to output the addition result |a'+b'|, and the shifter 120 for halving the addition result |a'+b'| of the addition circuit 119.

Now, the operation of the embodiment will be described. As mentioned above, since the construction of the clock phase error detection circuit is the same as that shown in FIG. 3 excepting that the offset value generating circuit 113 and the subtraction circuit 114 are added, the basic operation of the clock phase error detection is similar to that of the circuit shown in FIG. 3, excepting for the operation of the offset value generating circuit 113 and the subtraction circuit 114.

Namely, the input signal "a" supplied through the input terminal 101 is supplied directly to one input of the subtraction circuit 104, and also supplied through the two delay circuits 102 and 103, as the one-data-period delay signal "b", to the other input of the subtraction circuit 104, which outputs a subtraction result (a−b). At the same time, the input signal "a" and the one-data-period delay signal "b" are supplied to the addition circuit 110, which outputs an addition result (a+b). Furthermore, the offset value generating circuit 113 receiving the input signal "a" and the one-data-period delay signal "b", generates the offset value "d", and the subtraction circuit 114 subtracts the offset value "d" from the ½-date-period delayed signal "c" to generate the phase error signal "e".]

On the basis of the subtraction result (a−b), the sing inversion circuit 107 inverts or does not invert the sign of the phase error signal "e", so that the phase error signal "f" is outputted from the sing inversion circuit 107 to the gate circuit 108. On the basis of the discrimination result of the discrimination circuit 105 which compares the absolute value |a−b| of the subtraction result of the subtraction circuit 104 with a first threshold supplied from the input terminal 106 in order to discriminate which is large, and the discrimination result of the discrimination circuit 111 which compares the absolute value |a+b| of the addition result of the addition circuit 110 with a second threshold supplied from the input terminal 112 in order to determine which is large, the gate circuit 108 is controlled either to output the phase error signal "f" outputted from the sing inversion circuit 107 to the output terminal 109, or to maintain a preceding output. The phase error signal "f" outputted from the output terminal 109 is supplied through the loop filter 535 to the voltage controlled oscillator 536, which reproduce the clock.

Here, similarly to the prior art, in the discrimination circuit 105, whether or not the signal "a", "b" changes to cross the "0" level, is discriminated on the basis of whether or not the absolute value |a−b| of the subtraction result of the subtraction circuit 104 is larger than the first threshold supplied from the input terminal 106 (the value corresponding to about 10% of a maximum signal change). In the discrimination circuit 111, whether or not the signal "a" and the signal "b" are in symmetry, is discriminated on the basis of whether or not the absolute value |a+b| of the addition result of the addition circuit 110 is larger than the second threshold supplied from the input terminal 112 (the value near to "0").

Figure 2:
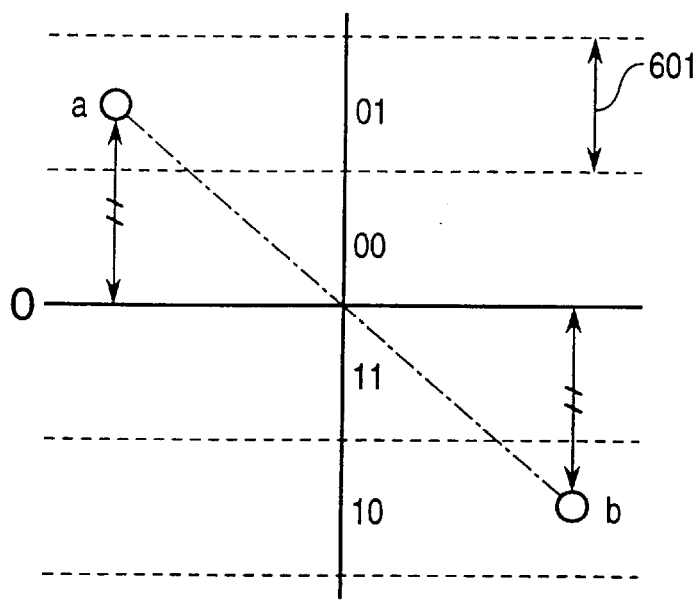
FIG. 2 is a graph illustrating a signal change in a prior art clock phase error detecting circuit.

Now, the additional function will be described. The prior art detects, as the phase error signal, only the zero cross change in which the signal so changes that the chain line in FIG. 2, which approximates the change between the signals "a" and "b" to a straight line, crosses the straight line "0" at an intermediate point of the one data period. On the other hand, in the present invention, in order to elevate the detection rate of the phase error, the signal change which does not cross the "0" level at an intermediate point of the one data period and which is therefore omitted from the phase error detection in the prior art, is detected for the purpose of the phase error detection, by compensating the signal change to a signal crossing the "0" level at an intermediate point of the one data period, as shown in FIG. 8.

Figure 8:
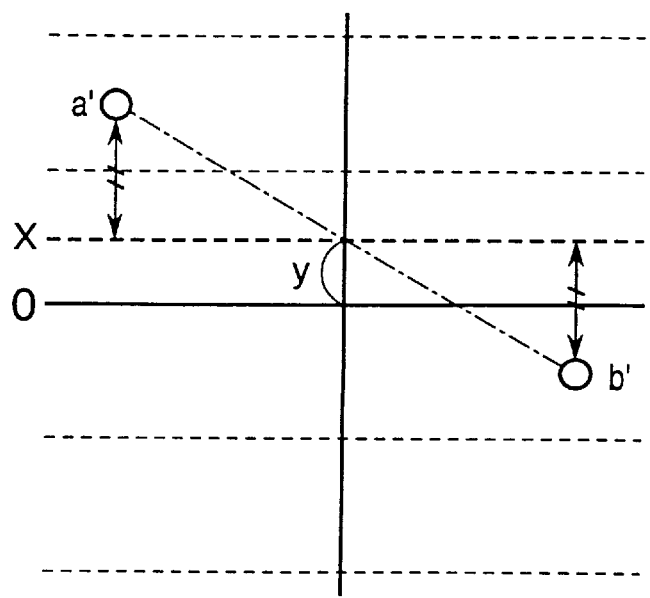
FIG. 8 is a graph illustrating the offset compensation performed in the embodiment of the clock phase error detecting circuit.

FIG. 8 is a graph illustrating the offset compensation performed in the embodiment of the clock phase error detecting circuit. As shown in FIG. 8, an intermediate level between the signal a' and the signal b' is made to a new reference level as shown by the dotted line X in FIG. 8, and the new reference level X is handled as the "0" level. In this manner, the signal change which does not cross the "0" level at an intermediate point of the one data period, can be detected by a method similar to the prior art phase error detecting method. However, since the dotted line level X actually is not the "0" level, the offset value generating circuit 113 generates the offset value "y" indicative of the deviation from the "0" level to the new reference level X which is the intermediate level between the signal a' and the signal b', and the subtraction circuit 114 subtracts the offset value "y" from the ½-data-period delayed signal "c" to obtain the phase error data.

In the offset value generating circuit 113, as shown in FIG. 7, the signals "a" and "b" are level-compensated by the slicers 117 and 118, respectively, which generate the signals a' and b' which are normalized signals of the signals "a" and "b". The signals a' and b' are added by the addition circuit 119 to generate the addition result {a'+b'}, which is halved by the shifter 120.

By the offset compensation, it becomes possible to make the threshold given to the discrimination circuit 111, larger that given to the discrimination circuit 711 in the prior art. With this, it is possible to increase the signal changes which can be used for the phase error detection, to one half (½) of all the signal changes at a maximum. Therefore, in this embodiment, the data updating times increases, so that the response to the frequency variation becomes quick, and the clock is reproduced with a high degree of precision and with less jitter component.

Figure 9:
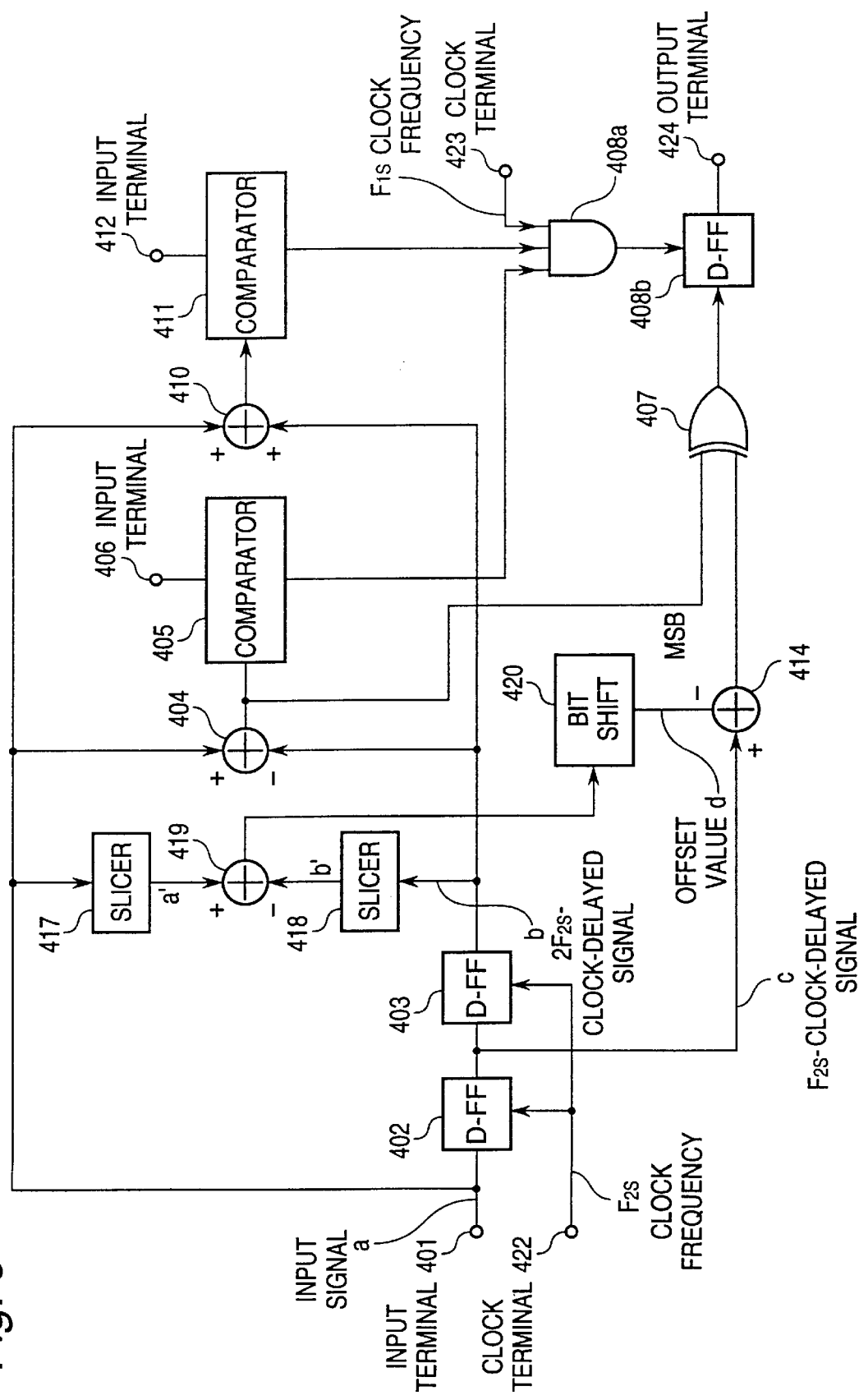
FIG. 9 is a detailed block diagram of the embodiment of the clock phase error detecting circuit in accordance with the present invention.

Referring to FIG. 9, there is shown a detailed block diagram of the embodiment of the clock phase error detecting circuit in accordance with the present invention. In FIG. 9, Reference Numeral 401 designates an input terminal 401, and Reference Numerals 402, 403 and 408b indicate D-type flipflop. Reference Numerals 404 and 414 denote a subtracter, and Reference Numerals 405 and 411 show a comparator. Reference Numerals 406 and 412 designate a threshold input terminal, and Reference Numeral 407 indicates an exclusive-OR circuit (XOR circuit). Reference Numeral 408a denotes an AND circuit, and Reference Numerals 410 and 419 show an addition circuit. Reference Numerals 417 and 418 designate a slicer, and Reference Numeral 420 denotes a bit shift circuit. Reference Numerals 422 and 423 show a clock input terminal, and Reference Numeral 424 indicates an output terminal. Reference Character "a" shows an input signal, and Reference Character "b" indicates a one-data-period delay signal. Reference Character "c" denotes a ½-data-period delayed signal, and Reference Character "d" designates an offset value. Reference Characters $F_{1S}$ and $F_{2S}$ indicate a clock frequency.

Here, the input signal "a" inputted to the input terminal 410 is the in-phase signal "I" which is sampled at the frequency $F_{2S}$ which is a double of the data rate $F_{1S}$.

In the embodiment, the cascaded D-type flipflop circuits 402 and 403 are driven with a reproduced clock having the frequency $F_{2S}$, supplied through the clock terminal 422. Therefore, in the D-type flipflop circuit 402, the input signal "a" is delayed by one clock having the frequency $F_{2S}$, to generate the $F_{2S}$-clock-delayed signal "c", and in the D-type flipflop circuit 403, the $F_{2S}$-clock-delayed signal "c" is further delayed by one clock having the frequency $F2_S$, to generate the $2F_{2S}$-clock-delayed signal "b". The slicer 417 discriminates the level of the input signal "a" to output a normalized signal a', and the slicer 418 discriminates the level of the $2F_{2S}$-clock-delayed signal "b" to output a normalized signal b'. The subtracter 419 subtracts the normalized signal b' from the normalized signal a' to output the difference {a'−b'}. The bit shift circuit 420 receives the difference {a'−b'} to output, as the offset value "d", a half of the difference {a'−b'} by shifting the difference {a'−b'} by one bit. The offset value "d" is subtracted from the $F2_S$-clock-delayed signal "c" by the subtracter 414.

In this embodiment, each of the slicers 417 and 418 operates as follows: In the case that the input signal "a" is a 8-bit 64QAM signal, three bits from the most significant bit (MSB) of the input signal "a" are picked up, and "1" is added to the least significant bit (LSB) of the picked-up three-bit data, so that a four-bit data is prepared. In order to match with the input signal "a", 4 bits of "0" are added to the LSB side of the four-bit data thus prepared. Thus, the normalization is carried by this level compensation. Specifically, the 8-bit input signal is ORed with "$10_H$" (the suffix indicates the hexadecimal notation), and then, is ANDed with "$F0_H$".

The exclusive-OR circuit 407 performs an exclusive-OR operation between the output of the subtracter 414 and the MSB bit of the output {a−b} of the subtracter 404, to invert the sign of the output of the subtracter 414. When the MSB bit of the output {a−b} of the subtracter 404 is "H", the sign of the output of the subtracter 414 is inverted. When the MSB bit of the output {a−b} of the subtracter 404 is "L", the sign of the output of the subtracter 414 is not inverted.

The comparator 405 compares the absolute value |a−b| of the difference {a−b} outputted from the subtracter 404, with the first threshold supplied through the input terminal 406, and the comparator 411 compares the absolute value |a+b| of the addition {a+b} outputted from the addition circuit 410, with the second threshold supplied through the input terminal 412.

When the absolute value |a−b| is larger than the first threshold, the comparator 405 outputs a "H" signal to the AND circuit 408, and when the absolute value |a+b| is smaller than the second threshold, the comparator 411 outputs a "H" signal to the AND circuit 408, When both the comparators 405 and 411 output the "H" signal, the AND circuit 408a output a "H" signal to the D-type flipflop 408b in time with the clock of the frequency $F1_S$ supplied from the clock terminal 423.

As seen from the above, according to the present invention, the clock can be reproduced from a multilevel QAM signal, with a high degree of precision and with a less jitter component. The reason for this is that the introduction of the offset value makes it possible to give to the discriminating circuit 111 the threshold which is large than that in the prior art, so that the data updating times can be increased in comparison with the prior art.

The invention has thus been shown and described with reference to the specific embodiments. However, it should be noted that the present invention is in no way limited to the details of the illustrated structures but changes and modifications may be made within the scope of the appended claims.

What is claimed is:

1. A clock reproducing circuit for use in a multilevel QAM demodulation circuit including at least a local carrier reproducing means for generating a first local carrier and a second local carrier having a phase difference of 90° from said first local carrier, a first multiplication-detection circuit for multiplication-detecting an input multilevel QAM signal by said first local carrier to generate an analog in-phase signal, a second multiplication-detection circuit for multiplication-detecting said input multilevel QAM signal by said second local carrier to generate an analog quadrature signal, a first analog-to-digital converter receiving said analog in-phase signal through a first low pass filter to generate a digital in-phase signal, a second analog-to-digital converter receiving said analog quadrature signal through a second low pass filter to generate a digital quadrature signal, the clock reproducing circuit including a clock phase error detecting circuit receiving one of said digital in-phase signal and said digital quadrature signal to generate a phase error signal, and a voltage controlled oscillator receiving said phase error signal through a loop filter, for generating a clock which is supplied to said first and second analog-to-digital converters, said clock phase error detecting circuit comprising:

first and second delay circuits receiving, as a digital input signal, said one of said digital in-phase signal and said digital quadrature signal, said first delay circuit generating a ½-data period delayed signal, and said second delay circuit generating a one-data period delayed signal;

an offset value generating circuit receiving said digital input signal and said one-data period delayed signal for generating an offset value;

a first subtracting circuit for subtracting said offset value from said ½-data period delayed signal to generate a first phase error signal;

a second subtracting circuit for subtracting said one-data period delayed signal from said digital input signal to generate a subtraction result signal;

a sign inverting circuit for selectively inverting the sign of said first phase error signal on the basis of said subtraction result signal, to output a second phase error signal;

a first discriminating circuit for comparing said subtraction result signal with a first threshold to output a first discrimination result signal;

an addition circuit for adding said one-data period delayed signal to said digital input signal to generate an addition result signal;

a second discriminating circuit for comparing said addition result signal with a second threshold to output a second discrimination result signal; and a gate circuit controlled by said first and second discrimination result signals either to output said second phase error signal as said phase error signal or output a held signal as said phase error signal.

2. A clock reproducing circuit claimed in claim 1 wherein said offset value generating circuit includes a first slicer receiving said digital input signal for level-discriminating said digital input signal, a second slicer receiving said one-data period delayed signal for level-discriminating said one-data period delayed signal, an adder for adding output signals of said first and second slicers, and a shifter for halving an output of the adder.

* * * * *